(12) United States Patent
Cao et al.

(10) Patent No.: US 12,154,470 B2
(45) Date of Patent: Nov. 26, 2024

(54) GATE DRIVING CIRCUIT AND DISPLAY PANEL (71) Applicant: WUHAN CHINA STAR OPTOELECTRONICS TECHNOLOGY CO., LTD., Wuhan (CN)

(72) Inventors: Haiming Cao, Wuhan (CN); Yanqing Guan, Wuhan (CN); Chao Tian, Wuhan (CN); Fei Ai, Wuhan (CN); Guanghui Liu, Wuhan (CN); Zhifu Li, Wuhan (CN)

( * ) Notice: Subject to any disclaimer, the term of this patent is extended or adjusted under 35 U.S.C. 154(b) by 0 days.

(21) Appl. No.: 17/617,608

(22) PCT Filed: Oct. 29, 2021

(86) PCT No.: PCT/CN2021/127378
§ 371 (c)(1),
(2) Date: Dec. 9, 2021

(87) PCT Pub. No.: WO2023/065388
PCT Pub. Date: Apr. 27, 2023

(65) Prior Publication Data
US 2024/0005829 A1  Jan. 4, 2024

(30) Foreign Application Priority Data
Oct. 19, 2021  (CN) .......................... 202111213295.7

(51) Int. Cl.
G09G 3/20       (2006.01)
G09G 3/3266    (2016.01)
(Continued)

(52) U.S. Cl.
CPC ............. *G09G 3/20* (2013.01); *G09G 3/3266* (2013.01); *G09G 3/3674* (2013.01);
(Continued)

(58) Field of Classification Search
CPC ............. G09G 3/20; G09G 2310/0267; G09G 2330/021; G09G 3/3266; G09G 3/3674;
(Continued)

(56) References Cited

U.S. PATENT DOCUMENTS

| 10,490,141 B1 | 11/2019 | Novoselov et al. |
| 2010/0182226 A1* | 7/2010 | Umezaki ................ G11C 19/28 345/98 |
| 2015/0015536 A1 | 1/2015 | Chang et al. |

FOREIGN PATENT DOCUMENTS

| CN | 105469754 A | 4/2016 |
| CN | 105489180 A | 4/2016 |

(Continued)

OTHER PUBLICATIONS

International Search Report in International application No. PCT/CN2021/127378, mailed on Jul. 19, 2022.
(Continued)

*Primary Examiner* — Douglas M Wilson (57) ABSTRACT

A gate driving circuit and a display panel are disclosed. A pull-up control module and a pull-down module of each stage gate driving unit are connected to a first node. A thin film transistor in the pull-up control module and/or pull-down module that is connected to the first node is an oxide thin film transistor, such that a leakage current of the first node is reduced due to the advantage of the small off-state leakage current of the oxide thin film transistor. Therefore, the voltage level of the first node can remain stable during a pull-up stage and a touch suspension stage.

18 Claims, 6 Drawing Sheets

(51) Int. Cl.
*G09G 3/36* (2006.01)
*H01L 29/786* (2006.01)

(52) U.S. Cl.
CPC ... *G09G 3/3677* (2013.01); *G09G 2310/0267* (2013.01); *G09G 2330/021* (2013.01); *H01L 29/786* (2013.01); *H01L 29/7869* (2013.01)

(58) Field of Classification Search
CPC .. G09G 3/3677; H01L 29/786; H01L 29/7869
See application file for complete search history.

(56) References Cited

FOREIGN PATENT DOCUMENTS

| CN | 106228942 | A |   | 12/2016 |          |
|----|-----------|---|---|---------|----------|
| CN | 107749281 | A | * | 3/2018  | G09G 3/3674 |
| CN | 108021275 | A |   | 5/2018  |          |
| CN | 108806584 | A |   | 11/2018 |          |
| CN | 108877626 | A |   | 11/2018 |          |
| CN | 109243358 | A |   | 1/2019  |          |
| CN | 110782855 | A |   | 2/2020  |          |
| CN | 111312177 | A |   | 6/2020  |          |
| CN | 111681626 | A | * | 9/2020  |          |
| CN | 112509531 | A |   | 3/2021  |          |
| CN | 113257168 | A |   | 8/2021  |          |
| CN | 113506534 | A |   | 10/2021 |          |

OTHER PUBLICATIONS

Written Opinion of the International Search Authority in International application No. PCT/CN2021/127378,mailed on Jul. 19, 2022.
Chinese Office Action issued in corresponding Chinese Patent Application No. 202111213295.7 dated Nov. 29, 2022, pp. 1-9.

* cited by examiner

GATE DRIVING CIRCUIT AND DISPLAY PANEL

FIELD OF INVENTION

The present disclosure relates to the field of display technology, and more particularly, to a gate driving circuit and a display panel.

BACKGROUND OF INVENTION

Gate driver on array (GOA) technology is a gate driving technology in which gate driving circuits of a display panel are integrated on a glass substrate. Since GOA technology can simplify the bonding process of external ICs, the product costs may be reduced, thereby facilitating the fabrication of display products with narrow bezels or without bezels.

The existing GOA circuit includes a plurality of gate driving units which are connected in cascade, and each one of the stage gate driving units drives one stage of horizontal scanning lines correspondingly. Each one of the stage gate driving units mainly includes a pull-up circuit, a pull-up control circuit, and a pull-down circuit. The pull-up circuit is mainly responsible for outputting the gate driving signals based on the clock signals. The pull-up control circuit controls an activation time of the pull-up circuit by rising a pull-up node. The pull-up control circuit is generally connected to receive the gate driving signal transmitted from the previous stage gate driving unit. The pull-down circuit is responsible for pulling down the pull-up node and the gate driving signal to have a low voltage level in a first time.

The touch suspension stage means a stage in which the gate driving signal is not outputted since the gate driving circuit needs to detect and collect touch signals for a touch screen during a normal display stage. The gate driving signal is not outputted until the accomplishment of detection and collection of the touch signals. During the said stage, the pull-up node is required to maintain the high voltage level. That is, compared with the pull-up stage, which is short, the touch suspension stage is longer, and the pull-up node is required to maintain the high voltage level for a longer time. It can be seen that the stability of the voltage level of the pull-up node plays an important role for the stable operation of the GOA circuit.

Moreover, thin film transistors are the basic components of the gate driving circuit. According to the manufacturing materials of the thin film transistor, the thin film transistors can be classified into amorphous silicon (A-Si) thin film transistors, low-temperature polycrystalline silicon (LTPS) thin film transistors, and oxide (IGZO) thin film transistors. Since the mobilities of the low-temperature polycrystalline silicon thin film transistor and oxide thin film transistor are much greater than the mobility of the amorphous silicon thin film transistor, wherein the mobility of the low-temperature polycrystalline silicon thin film transistor is greater than the mobility of the oxide thin film transistor, the gate driving circuit is mostly made of the low-temperature polycrystalline silicon thin film transistors. However, due to the large leakage current of the low-temperature polycrystalline silicon thin film transistor, the voltage level of the pull-up node of the gate driving circuit tends to be lowered by the leakage current of the connected thin film transistor during the pull-up stage and the touch suspension stage and cannot maintain a stable voltage level, which results in the failure of the gate driving unit in the touch suspension stage, thereby leading to a split-screen phenomenon of the display panel.

Therefore, there is a requirement for providing a new gate driving circuit to solve the aforementioned problem of the abnormal display of the display panel that may be caused by the leakage current of the pull-up node of the gate driving circuit.

SUMMARY OF INVENTION

Technical Problem

Since the leakage current of the low-temperature polycrystalline silicon thin film transistor is large, the voltage level of the pull-up node of the gate driving circuit tends to be lowered by the leakage current of the connected thin film transistor during the pull-up stage and the touch suspension stage and cannot maintain a stable voltage level, which results in the failure of the gate driving unit in the touch suspension stage, thereby leading to a split-screen phenomenon of the display panel.

Technical Solutions

In order to solve the existing problem of the abnormal display of the display panel that may be caused by the leakage current of the pull-up node of the gate driving circuit, a gate driving circuit and a display panel are disclosed in embodiments of the present disclosure.

In a first aspect, a gate driving circuit is disclosed in embodiments of the present disclosure, and the gate driving circuit includes a plurality of gate driving units connected in cascade, wherein each stage of the gate driving units includes a pull-up control module 100 and a pull-down module 300.

The pull-up control module 100 is connected to a first node Q, a forward scanning signal output terminal, a reverse scanning signal output terminal, an (n−m)-th stage gate driving signal output terminal, and an (n+m)-th stage gate driving signal output terminal, and is configured for pulling up a voltage level of the first node under controls of a signal outputted from the forward scanning signal output terminal, a signal outputted from the reverse scanning signal output terminal, a signal outputted from the (n−m)-th stage gate driving signal output terminal, and a signal outputted from the (n+m)-th stage gate driving signal output terminal, wherein n and m are positive integers, and n>m.

The pull-down module is connected to the first node, a constant low voltage, an (n+m)-th clock signal output terminal, and an (n−m)-th clock signal output terminal, and is configured for pulling down the voltage level of the first node under controls of the constant low voltage, an (n+m)-th clock signal, and an (n−m)-th clock signal.

Moreover, a thin film transistor in the pull-up control module and/or the pull-down module that is connected to the first node is an oxide thin film transistor.

In some embodiments, the pull-up control module includes a first thin film transistor and a second thin film transistor. A gate of the first thin film transistor is connected to the (n−m)-th stage gate driving signal output terminal, a gate of the second thin film transistor is connected to the (n+m)-th stage gate driving signal output terminal, a source of the first thin film transistor is connected to the forward scanning signal output terminal, a source of the second thin film transistor is connected to the reverse scanning signal output terminal, and a drain of the first thin film transistor and a drain of the second thin film transistor are both connected to the first node, wherein the first thin film transistor and the second thin film transistor are oxide thin film transistors.

In some embodiments, the pull-down module includes a fifth thin film transistor and a sixth thin film transistor. A gate of the fifth thin film transistor is connected to the (n+m)-th clock signal output terminal or the (n−m)-th clock signal output terminal, a source of the fifth thin film transistor is connected to the first node, a drain of the fifth thin film transistor is connected to a source of the sixth thin film transistor, and a drain of the sixth thin film transistor is connected to receive the constant low voltage, wherein the fifth thin film transistor is an oxide thin film transistor.

In some embodiments, the n-th stage gate driving unit further includes a pull-up module, and the pull-up module includes a third thin film transistor and a fourth thin film transistor. A gate of the third thin film transistor is connected to receive a constant high voltage, a source of the third thin film transistor is connected to the first node, a drain of the third thin film transistor and a gate of the fourth thin film transistor are both connected to a fourth node, a source of the fourth thin film transistor is connected to an n-th clock signal output terminal, and a drain of the fourth thin film transistor is connected to an n-th stage gate driving signal output terminal.

In some embodiments, the pull-down module further includes an eleventh thin film transistor. A gate of the eleventh thin film transistor is connected to a second node, a source of the eleventh thin film transistor is connected to the n-th stage gate driving signal output terminal, and a drain of the eleventh thin film transistor is connected to receive the constant low voltage.

In some embodiments, the n-th stage gate driving unit further includes a voltage-stabilizing module, and the voltage-stabilizing module includes a first capacitor and a second capacitor. One terminal of the first capacitor is connected to the first node, one terminal of the second capacitor is connected to the second node, and another terminal of the first capacitor and another terminal of the second capacitor are both connected to a constant low voltage output terminal.

In some embodiments, the n-th stage gate driving unit further includes a gate signal activation module, and the gate signal activation module includes a twelfth thin film transistor, a thirteenth thin film transistor, and a fourteenth thin film transistor. A gate and a drain of the twelfth thin film transistor, a gate of the thirteenth thin film transistor, and a gate of the fourteenth thin film transistor are all connected to a first global control signal output terminal, a source of the twelfth thin film transistor is connected to a fourth node, a source of the thirteenth thin film transistor and a source of the fourteenth thin film transistor are both connected to a second node, and a drain of the thirteenth thin film transistor and a drain of the fourteenth thin film transistor are both connected to a constant low voltage output terminal.

In some embodiments, the n-th stage gate driving unit further includes a gate signal deactivation module, and the gate signal deactivation module includes a fifteenth thin film transistor. A gate of the fifteenth thin film transistor is connected to a second global control signal output terminal, a source of the fifteenth thin film transistor is connected to an n-th stage gate signal output terminal, and a drain of the fifteenth thin film transistor is connected to a constant low voltage output terminal.

In a second aspect, another gate driving circuit is further disclosed in embodiments of the present disclosure. The gate driving circuit includes a plurality of gate driving units connected in cascade, wherein an n-th stage gate driving unit includes a first thin film transistor, a second thin film transistor, and a fifth thin film transistor. A gate of the first thin film transistor is connected to an (n−m)-th stage gate driving signal output terminal, a gate of the second thin film transistor is connected to an (n+m)-th stage gate driving signal output terminal, a source of the first thin film transistor is connected to a forward scanning signal output terminal, a source of the second thin film transistor is connected to a reverse scanning signal output terminal, a drain of the first thin film transistor and a drain of the second thin film transistor are both connected to the first node, a gate of the fifth thin film transistor is connected to an (n+m)-th clock signal output terminal or an (n−m)-th clock signal output terminal, and a source of the fifth thin film transistor is connected to the first node, wherein at least one of the first thin film transistor, the second thin film transistor, and the fifth thin film transistor is an oxide thin film transistor.

In some embodiments, the n-th stage gate driving unit further includes a sixth thin film transistor. A gate of the sixth thin film transistor is connected to a second node, a drain of the fifth thin film transistor is connected to a source of the sixth thin film transistor, and a drain of the sixth thin film transistor is connected to receive a constant low voltage.

In some embodiments, the n-th stage gate driving unit further includes a third thin film transistor and a fourth thin film transistor. A gate of the third thin film transistor is connected to receive a constant high voltage, a source of the third thin film transistor is connected to the first node, a drain of the third thin film transistor and a gate of the fourth thin film transistor are connected to a fourth node, a source of the fourth thin film transistor is connected to an n-th clock signal output terminal, and a drain of the fourth thin film transistor is connected to an n-th stage gate driving signal output terminal.

In some embodiments, the n-th stage gate driving unit further includes an eleventh thin film transistor. A gate of the eleventh thin film transistor is connected to a second node, a source of the eleventh thin film transistor is connected to an n-th stage gate driving signal output terminal, and a drain of the eleventh thin film transistor is connected to receive a constant low voltage.

In some embodiments, the n-th stage gate driving unit further includes a first capacitor and a second capacitor. One terminal of the first capacitor is connected to the first node, one terminal of the second capacitor is connected to the second node, and another terminal of the first capacitor and another terminal of the second capacitor are both connected to a constant low voltage output terminal.

In some embodiments, the n-th stage gate driving unit further includes a twelfth thin film transistor, a thirteenth thin film transistor, and a fourteenth thin film transistor. A gate and a drain of the twelfth thin film transistor, a gate of the thirteenth thin film transistor, and a gate of the fourteenth thin film transistor are all connected to a first global control signal output terminal, a source of the twelfth thin film transistor is connected to a fourth node, a source of the thirteenth thin film transistor and a source of the fourteenth thin film transistor are both connected to a second node, and a drain of the thirteenth thin film transistor and a drain of the fourteenth thin film transistor are both connected to a constant low voltage output terminal.

In some embodiments, the n-th stage gate driving unit further includes a fifteenth thin film transistor. A gate of the fifteenth thin film transistor is connected to the second global control signal output terminal, a source of the fifteenth thin film transistor is connected to the n-th stage gate signal output terminal, and a drain of the fifteenth thin film transistor is connected to the constant low voltage output terminal.

In a third aspect, a display panel is further disclosed in embodiments of the present disclosure. The display panel includes the gate driving circuit as described in any one of the above embodiments.

In some embodiments, the gate driving circuit includes a plurality of gate driving units connected in cascade, and an n-th stage gate driving unit includes a first thin film transistor, a second thin film transistor, and a fifth thin film transistor. A gate of the first thin film transistor is connected to an (n−m)-th stage gate driving signal output terminal, a gate of the second thin film transistor is connected to an (n+m)-th stage gate driving signal output terminal, a source of the first thin film transistor is connected to a forward scanning signal output terminal, a source of the second thin film transistor is connected to a reverse scanning signal output terminal, a drain of the first thin film transistor and a drain of the second thin film transistor are both connected to the first node, a gate of the fifth thin film transistor is connected to an (n+m)-th clock signal output terminal or an (n−m)-th clock signal output terminal, and a source of the fifth thin film transistor is connected to the first node, wherein at least one of the first thin film transistor, the second thin film transistor, and the fifth thin film transistor is an oxide thin film transistor.

In some embodiments, the n-th stage gate driving unit further includes a sixth thin film transistor. A gate of the sixth thin film transistor is connected to a second node, a drain of the fifth thin film transistor is connected to a source of the sixth thin film transistor, and a drain of the sixth thin film transistor is connected to receive a constant low voltage.

In some embodiments, the n-th stage gate driving unit further includes a third thin film transistor and a fourth thin film transistor. A gate of the third thin film transistor is connected to receive a constant high voltage, a source of the third thin film transistor is connected to the first node, a drain of the third thin film transistor and a gate of the fourth thin film transistor are both connected to a fourth node, a source of the fourth thin film transistor is connected to an n-th clock signal output terminal, and a drain of the fourth thin film transistor is connected to an n-th stage gate driving signal output terminal.

In some embodiments, the n-th stage gate driving unit further includes an eleventh thin film transistor. A gate of the eleventh thin film transistor is connected to a second node, a source of the eleventh thin film transistor is connected to the n-th stage gate driving signal output terminal, and a drain of the eleventh thin film transistor is connected to receive a constant low voltage.

Beneficial Effect

In the gate driving circuit and display panel disclosed in the embodiments of the present disclosure, the pull-up control module and pull-down module of each one of the stage gate driving units are connected with the first node, wherein the thin film transistor connected with the first node in the pull-up control module and/or pull-down module is an oxide thin film transistor, such that a leakage current of the first node is reduced due to the advantage of the small off-state leakage current of the oxide thin film transistor. Therefore, the voltage level of the first node can remain stable during the pull-up stage and the touch suspension stage, thereby avoiding the abnormal image displayed by the display panel caused by the unstable voltage level of the first node.

DETAILED DESCRIPTION OF PREFERRED EMBODIMENTS

In order to make the purpose, technical solutions, and effects of the present disclosure clearer and more definite, the present disclosure is further described in detail below with reference to the attached drawings and embodiments. It should be understood that the specific embodiments described herein are only used to explain the present disclosure, and the present disclosure is not limited thereto.

Figure 1:
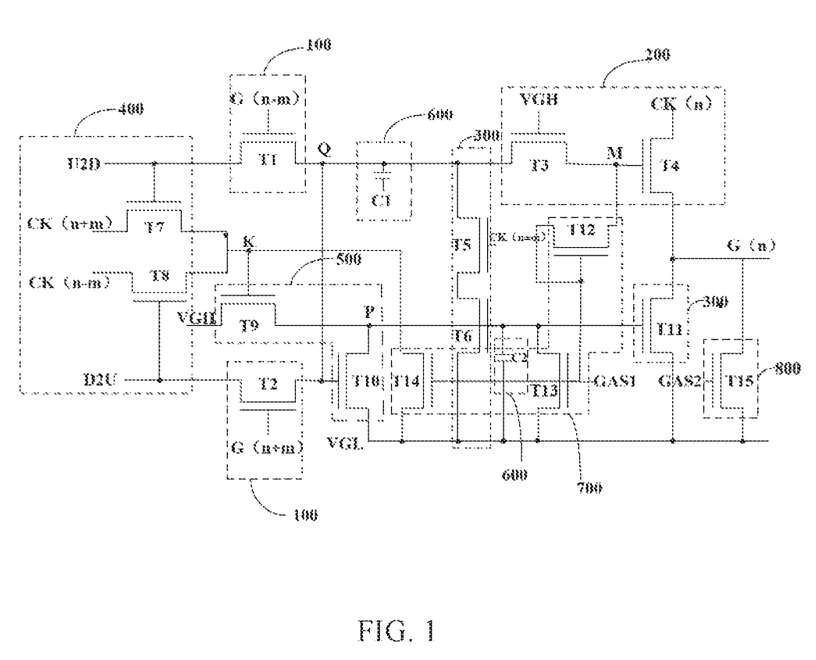
FIG. 1 is a circuit diagram of a gate driving circuit disclosed in an embodiment of the present disclosure.

Reference is made to FIG. 1. FIG. 1 is a circuit diagram of a gate driving circuit disclosed in an embodiment of the present disclosure. The embodiment of the present disclosure provides a gate driving circuit. The gate driving circuit includes a plurality of gate driving units connected in cascade, and each one of the stage gate driving units includes a pull-up control module 100 and a pull-down module 300.

The pull-up control module 100 is connected to a first node Q, an output terminal of a forward scanning signal U2D, an output terminal of a reverse scanning signal D2U, an output terminal of an (n−m)-th stage gate driving signal G(n−m), and an output terminal of an (n+m)-th stage gate driving signal G(n+m), and is configured for pulling up a voltage level of the first node Q under controls of the forward scanning signal U2D, the reverse scanning signal D2U, the (n−m)-th stage gate driving signal G(n−m), and (n+m)-th stage gate driving signal G(n+m), wherein n and m both are positive integers, and n>m.

Specifically, the pull-up control module 100 is connected to the first node Q, the output terminal of the forward scanning signal U2D and the output terminal of the (n−m)-th stage gate driving signal G(n−m) for pulling up the voltage level of the first node Q under the control of the (n−m)-th stage gate driving signal G(n−m) through the forward scanning signal U2D; alternatively, the pull-up control module 100 is connected to the output terminal of the reverse scanning signal D2U and the output terminal of the (n+m)-th stage gate driving signal G(n+m) for pulling up the voltage level of the first node Q under the control of the (n+m)-th stage gate driving signal G(n+m) through the reverse scanning signal D2U.

Furthermore, the pull-down module 300 is connected to the first node Q and receives a constant low voltage VGL, and is connected to an output terminal of an (n+m)-th clock signal CK(n+m) or an output terminal of an (n−m)-th clock signal CK(n−m). The pull-down module 300 is configured for pulling down the voltage level of the first node Q through the constant low voltage VGL under the control of the (n+m)-th clock signal CK(n+m) or the (n−m)-th clock signal CK(n−m).

The thin film transistor connected to the first node Q in the pull-up control module 100 and/or the pull-down module 300 is an oxide thin film transistor.

In the gate driving circuit disclosed in the embodiments of the present disclosure, the pull-up control module 100 and pull-down module 300 of each one of the stage gate driving units are connected with the first node Q, wherein the thin film transistor connected with the first node Q in the pull-up control module 100 and/or pull-down module 300 is the oxide thin film transistor, such that a leakage current of the first node Q is reduced due to the advantage of the small off-state leakage current of the oxide thin film transistor. Therefore, the voltage level of the first node Q can remain stable during the pull-up stage and the touch suspension stage, thereby avoiding the abnormal image displayed by the display panel caused by the unstable voltage level of the first node Q.

Furthermore, the pull-up control module 100 includes a first thin film transistor T1 and a second thin film transistor T2. A gate of the first thin film transistor T1 is connected to the output terminal of the (n−m)-th stage gate driving signal G(n−m), a gate of the second thin film transistor T2 is connected to the output terminal of the (n+m)-th stage gate driving signal G(n+m), a source of the first thin film transistor T1 is connected to the output terminal of the forward scanning signal U2D, a source of the second thin film transistor T2 is connected to the output terminal of the reverse scanning signal D2U, and a drain of the first thin film transistor T1 and a drain of the second thin film transistor T2 are both connected to the first node Q, wherein n and m are both positive integers, and n>m. Moreover, the phases of the forward scanning signal U2D and the reverse scanning signal D2U are reversal. That is, one of the forward scanning signal U2D and the reverse scanning signal D2U is has a high voltage level and the other has a low voltage level.

Furthermore, the pull-down module 300 includes a fifth thin film transistor T5 and a sixth thin film transistor T6. A gate of the fifth thin film transistor T5 is connected to the output terminal of the (n+m)-th clock signal CK(n+m) (when forward scanning) or the output terminal of the (n−m)-th clock signal CK(n−m) (when reverse scanning), a source of the fifth thin film transistor T5 is connected to the first node Q, a drain of the fifth thin film transistor T5 is connected to a source of the sixth thin film transistor T6, and a drain of the sixth thin film transistor T6 is connected to receive the constant low voltage level VGL.

Moreover, at least one of the first thin film transistor T1, the second thin film transistor T2, and the fifth thin film transistor T5 is the oxide thin film transistor.

In the gate driving circuit disclosed in the embodiments of the present disclosure, the first thin film transistor T1 and the second thin film transistor T2 in the pull-up control module 100 are connected with the first node Q, and the fifth thin film transistor T5 in the pull-down module 300 is connected with the first node Q. At least one of the first thin film transistor T1, the second thin film transistor T2, and the fifth thin film transistor T5 adopts the oxide thin film transistor, so that the leakage current of the first node Q is reduced due to the small off-state leakage current of the oxide thin film transistor. Moreover, the gate of the fifth thin film transistor T5 is connected to the output terminal of the (n+m)-th clock signal CK(n+m) or the output terminal of the (n−m)-th clock signal CK(n−m), so that the gate of the fifth thin film transistor T5 is unlike the gate of the sixth thin film transistor T6, which is connected to a second node P, keeps the high voltage level for a long time, and is affected by the stress, thereby enhancing the stability of the fifth thin film transistor T5. Thus, the stability of the first node Q is improved to enhance the stability of the gate driving circuit.

It can be understood that at least one of the first thin film transistor T1, the second thin film transistor T2, and the fifth thin film transistor T5 is the oxide thin film transistor. That is, any one of the first thin film transistor T1, the second thin film transistor T2, and the fifth thin film transistor T5 can be selected as the oxide thin film transistor, or any two thereof can be selected as the oxide thin film transistors, or all are the oxide thin film transistors. Therefore, the leakage current of the first node Q is reduced according to the small leakage current of the oxide thin film transistor in the off-state, so that the voltage level of the first node Q remains stable.

It should be noted that low-temperature polycrystalline oxide (LTPO) technology combines the advantages of LTPS and IGZO technologies, so that the display panel has the characteristics of strong driving ability and low power consumptions and meets the use requirements of both high frequency and low frequency. Therefore, LTPO technology is suitable for dynamic frame rate technology, which can improve the user's visual experience and optimize the power consumption. Hence, in the gate driving circuit disclosed in the embodiments of the present disclosure, except that at least one of the first thin film transistor T1, the second thin film transistor T2, and the fifth thin film transistor T5 is the oxide thin film transistor, the other thin film transistors may adopt low-temperature polycrystalline oxide. Accordingly, based on the low-temperature polycrystalline oxide technology, the advantages of the oxide thin film transistor and polysilicon oxide are combined, so that the gate driving circuit can not only reduce the leakage current of the first node Q, but also improve its driving ability, thereby meeting the use requirements of both high frequency and low frequency.

It should also be noted that thin film transistors can be classified into N-type thin film transistors and P-type thin film transistors according to their electrical characteristics. Since the carriers (major charge carrier) of the N-type thin film transistor are electrons and the carriers (major charge carrier) of the P-type thin film transistor are holes, the mobility of the N-type thin film transistor is greater than the mobility of the P-type thin film transistor. Moreover, the N-type thin film transistor can be turned on with a positive voltage, while the P-type thin film transistor needs to be turned on with a negative voltage. Therefore, in the view of control, the N-type thin film transistor is more convenient than the P-type thin film transistor. Based on the above two points, the existing gate driving circuits are mostly formed of the N-type thin film transistors. However, the stability of the N-type thin film transistor is lower than the stability of the P-type thin film transistor. Therefore, the N-type thin film transistor is not as stable as the P-type thin film transistor under a high temperature environment. That is, the electrical characteristic of the N-type thin film transistor tends to change under a high temperature environment, so that the leakage current is increased. Therefore, the gate driving circuit disclosed in the embodiments of the present disclosure is particularly suitable for the gate driving circuit formed of the N-type thin film transistors, especially the gate driving circuit in which the thin film transistors connected with the first node Q are the N-type thin film transistors. That is, in the gate driving circuit disclosed in the embodiments of the present disclosure, the first thin film transistor T1, the second thin film transistor T2 and the fifth thin film transistor T5 adopt the N-type oxide thin film transistors.

In some embodiments, the n-th stage gate driving unit further includes a pull-up module 200, and the pull-up module 200 includes a third thin film transistor T3 and a fourth thin film transistor T4. A gate of the third thin film transistor T3 is connected to receive a constant high voltage VGH, a source of the third thin film transistor T3 is connected to the first node Q, a drain of the third thin film transistor T3 and a gate of the fourth thin film transistor T4 are both connected to a fourth node M, a source of the fourth thin film transistor T4 is connected to an output terminal output of an n-th clock signal CK(n), and a drain of the fourth thin film transistor T4 is connected to an output terminal of an n-th stage gate driving signal G(n). The function of the third thin film transistor T3 is to prevent the high voltage level of a third node K from being feed back to the first node Q to lower the voltage level of the third node K, thereby keeping the voltage level of the third node K stable.

In some embodiments, the n-th stage gate driving unit further includes a forward and reverse scanning module 400, which includes a seventh thin film transistor T7 and an eighth thin film transistor T8. A gate of the seventh thin film transistor T7 is connected to the output terminal of the forward scanning signal U2D, a gate of the eighth thin film transistor T8 is connected to the output terminal of the reverse scanning module, a source of the seventh thin film transistor T7 is connected to the output terminal of the (n+m)-th clock signal CK(n+m), a source of the eighth thin film transistor T8 is connected to the output terminal of the (n−m)-th clock signal CK(n−m), and a drain of the seventh thin film transistor T7 and a drain of the eighth thin film transistor T8 are both connected to the third node K.

It should be noted that if the gate driving circuit adopts the forward scanning, the scanning is performed from the first stage gate driving unit to the last stage gate driving unit for the pixel rows. If the reverse scanning is adopted, the scanning is performed from the last stage gate driving unit to the first stage gate driving unit for the pixel rows.

It can be understood that when the gate driving circuit the performs the forward scanning, the gate of the first thin film transistor T1 of the first stage gate driving unit is connected to an output terminal of a start signal. When the reverse scanning is performed, the gate of the second thin film transistor T2 of the last stage gate driving unit is connected to the output terminal of the start signal.

In some embodiments, the n-th stage gate driving unit further includes a pull-down control module 500, which includes a ninth thin film transistor T9 and a tenth thin film transistor T10. A gate of the ninth thin film transistor T9 is connected to the third node K, a source of the ninth thin film transistor T9 is connected to receive the constant high voltage VGH, a drain of the ninth thin film transistor T9 and a source of the tenth thin film transistor T10 are connected to the second node P, a gate of the tenth thin film transistor T10 is connected to the first node Q, and a drain of the tenth thin film transistor T10 is connected to receive the constant low voltage VGL.

In some embodiments, the pull-down module 300 further includes an eleventh thin film transistor T11. A gate of the eleventh thin film transistor T11 is connected to the second node P, a source of the eleventh thin film transistor T11 is connected to the output terminal of the n-th stage gate driving signal G(n), and a drain of the tenth thin film transistor T10 is connected to receive the constant low voltage VGL.

In some embodiments, the n-th stage gate driving unit further includes a voltage stabilizing-module 600, which includes a first capacitor C1 and a second capacitor C2. One terminal of the first capacitor C1 is connected to the first node Q, one terminal of the second capacitor C2 is connected to the second node P, and another terminal of the first capacitor C1 and another terminal of the second capacitor C2 are both connected to receive the constant low voltage VGL.

It should be noted that in the gate driving circuit, every m consecutive gate driving units form a minimum repeating unit. For example, the (n−m)-th stage gate driving unit to the n-th stage gate driving unit may form one minimum repeating unit.

Furthermore, reference is made to FIG. 1. The n-th stage gate driving unit further includes a gate signal activation module 700. The function of the gate signal activation module 700 is to activate all gate driving units of the gate driving circuit to output the gate driving signals, so as to remove the residual charge. Therefore, there is no residual image when the display panel is turned on or turned off. In addition, all pixels can also be charged to an intermediate voltage when the display panel is turned on, so as to quickly respond to the first display image after booting and improve the user's appearance.

Specifically, the gate signal activation module 700 includes a twelfth thin film transistor T12, a thirteenth thin film transistor T13, and a fourteenth thin film transistor T14. A gate and a drain of the twelfth thin film transistor T12, a gate of the thirteenth thin film transistor T13, and a gate of the fourteenth thin film transistor T14 are all connected to an output terminal of a first global control signal GAS1, a source of the twelfth thin film transistor T12 is connected to the fourth node M, a source of the thirteenth thin film transistor T13 and a source of the fourteenth thin film transistor T14 are connected to the second node P, and a drain of the thirteenth thin film transistor T13 and a drain of the fourteenth thin film transistor T14 are connected to receive the constant low voltage VGL.

Furthermore, reference is made to FIG. 1, the n-th stage gate driving unit further includes a gate signal deactivation module 800. The function of the gate signal deactivation module 800 is to insert a touch scanning stage B during the normal display stage A to detect and collect the touch signals. Moreover, it is necessary to deactivate all gate driving units of the gate driving circuit outputting the gate driving signals. After the detection and collection of the touch signals are finished, the gate driving unit resumes outputting the gate driving signal stage by stage.

Specifically, the gate signal deactivation module 800 includes a fifteenth thin film transistor T15. A gate of the fifteenth thin film transistor T15 is connected to an output terminal of a second global control signal GAS2, a source of the fifteenth thin film transistor T15 is connected to the output terminal of the n-th stage gate driving signal G(n), and a drain of the fifteenth thin film transistor T15 is connected to receive the constant low voltage VGL.

Figure 2:
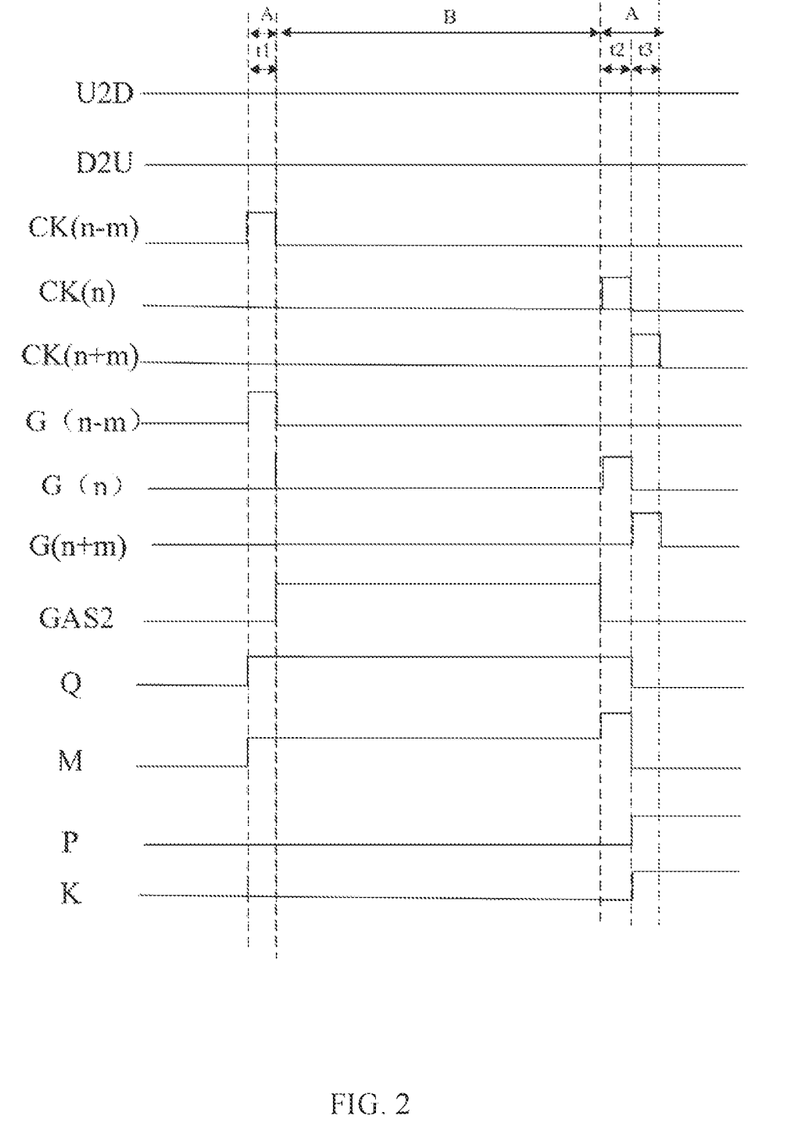
FIG. 2 is a first timing diagram of a gate driving circuit disclosed in an embodiment of the present disclosure.
Figure 3:
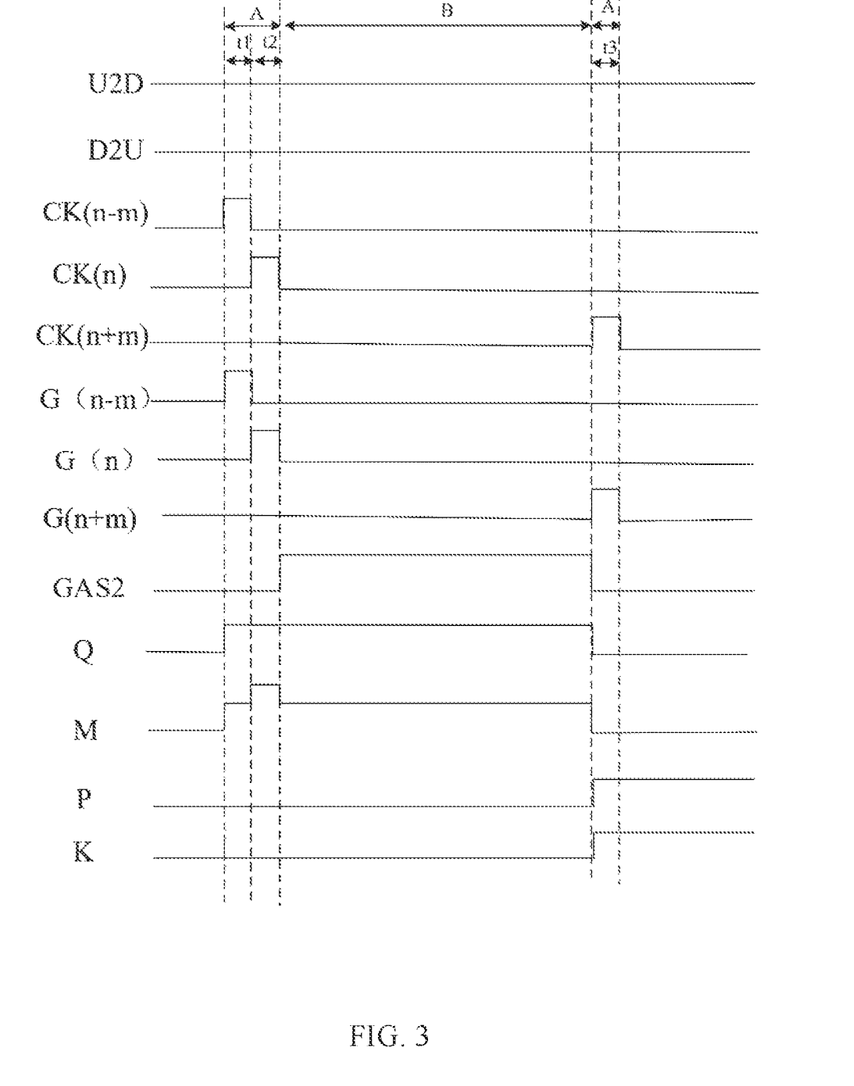
FIG. 3 is a second timing diagram of a gate driving circuit disclosed in an embodiment of the present disclosure.
Figure 4:
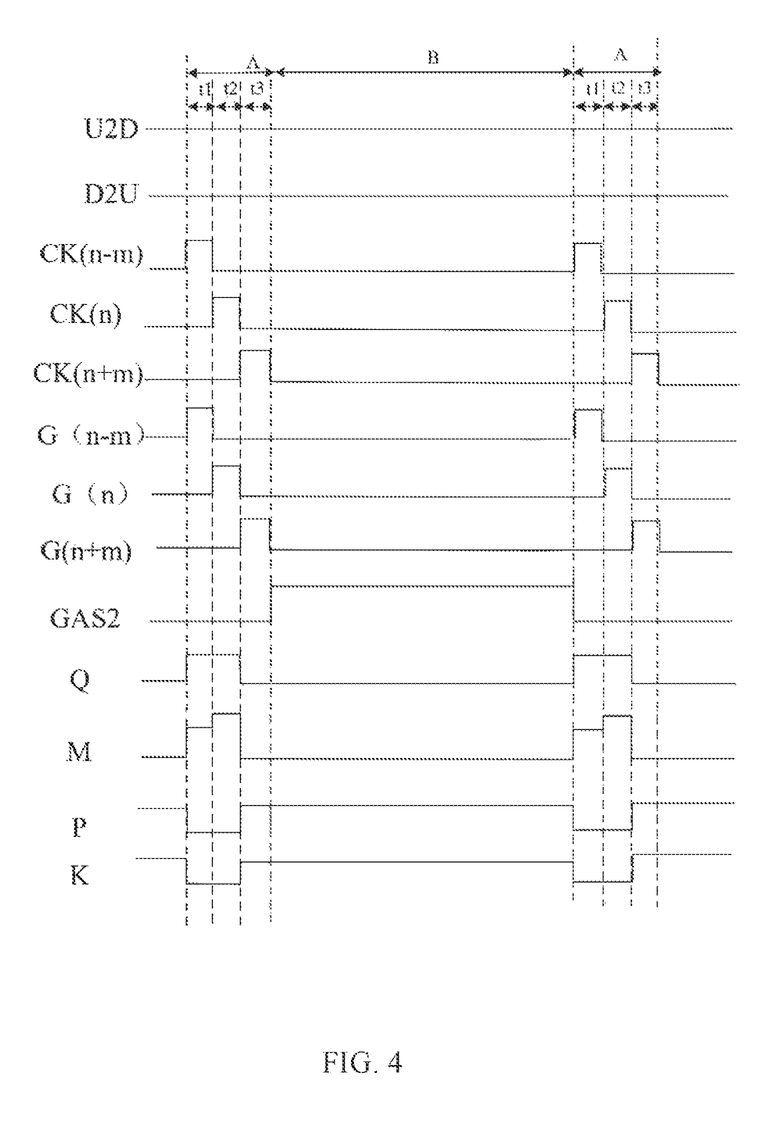
FIG. 4 is a third timing diagram of a gate driving circuit disclosed in an embodiment of the present disclosure.

Based on the aforementioned embodiments, FIG. 2, FIG. 3, and FIG. 4 are timing diagrams of the gate driving circuit disclosed in the embodiments of the present disclosure. References are made to FIG. 1 to FIG. 4, the working process of the n-th stage gate driving unit of the gate driving circuit is described in detail below. For convenience of explanation, the thin film transistors in the gate driving circuit being the N-type thin film transistors and the gate driving circuit adopting the forward scanning are taken as an example.

Specifically, the operation of the gate driving circuit includes a normal display stage A and a touch scanning stage B, and the touch scanning stage B is inserted into the normal display stage A. That is, in the normal display stage A, if a touch signal is received, each display signal stops and a touch scanning is performed. Each display signal is not inputted until the touch scanning is finished.

The normal display stage a includes a pre-charging sub-stage T1, an output sub-stage T2, and a pull-down sub-stage T3.

In the pre-charging sub-stage T1, the (n−m)-th stage gate driving signal G(n−m) is at a high voltage level to turn on the first thin film transistor T1, and the forward scanning signal U2D is at a high voltage level to increase the voltage levels of the first node Q and the fourth node M and charge the first capacitor C1. At this time, the first node Q turns on the tenth thin film transistor T10, so that the second node P is at the constant low voltage VGL to turn off the sixth thin film transistor T6 and the tenth thin film transistor T10.

If the touch scanning stage B is entered at this time, as shown in FIG. 2, the second global control signal GAS2 is at a high voltage level, so that the gate driving signals are all at a low voltage level and each display signal is in the stop state. At this time, the second thin film transistor T2 and the fifth thin film transistor T5 are in the off-state. Since the second thin film transistor T2 and the fifth thin film transistor T5 adopt the oxide thin film transistors, the off-state leakage currents of the second thin film transistor T2 and the fifth thin film transistor T5 are small, which can keep the voltage level of the first node Q in a relatively stable high voltage level. After the touch scanning is completed, the output sub-stage T2 is entered.

In the output sub-stage T2, the (n−m)-th stage gate driving signal G(n−m) is at a low voltage level to turn off the first thin film transistor T1. The first capacitor C1 keeps the first node Q at a high voltage level, so that the third node K is also at a high voltage level to turn on the fourth thin film transistor T4. At the same time, the n-th clock signal CK(n) is at a high voltage level to further pull up the voltage level of the third node M to a higher voltage level, and to make the n-th stage gate driving signal G(n) at a high voltage level. At this time, the first node Q keeps the tenth thin film transistor T10 being turned on, so that the second node P maintains the constant low voltage VGL to keep the sixth thin film transistor T6 and the tenth thin film transistor T10 being turned-off.

If the touch scanning stage B is entered at this time, as shown in FIG. 3, the second global control signal GAS2 is at a high voltage level, so that the gate driving signals are all at a low voltage level and each display signal is in the stop state. At this time, the first thin film transistor T1, the second thin film transistor T2, and the fifth thin film transistor T5 are in the off-state. Since the first thin film transistor T1, the second thin film transistor T2, and the fifth thin film transistor T5 adopt the oxide thin film transistors, the off-state leakage currents of the first thin film transistor T1, the second thin film transistor T2, and the fifth thin film transistor T5 are small, which can keep the voltage level of the first node Q in a relatively stable high voltage level. After the touch scanning is completed, the pull-down sub-stage T3 is entered.

In the pull-down sub-stage T3, the (n+m)-th clock signal CK(n+m) is at a high voltage level to increase the voltage level of the third node K and turns on the fifth thin film transistor T5. The third node K is at a high voltage level to turn on the ninth thin film transistor T9, so as to increase the voltage level of the second node P and charge the second capacitor C2. The second node P turns on the sixth thin film transistor T6 and the eleventh thin film transistor T11. At this time, the fifth thin film transistor T5 and the sixth thin film transistor T6 pull down the voltage level of the first node Q, the eleventh thin film transistor T11 pulls down the voltage level of the n-th stage gate driving signal G(n), and the second capacitor C2 maintains the second node P at a low voltage level.

If the touch scanning stage B is entered at this time, as shown in FIG. 4, the second global control signal GAS2 is at a high voltage level, so that the gate driving signals are all at a low voltage level. At the same time, each display signal is in the stop state. At this time, the first thin film transistor T1 and the second thin film transistor T2 are in the off-state. Since the first thin film transistor T1 and the second thin film transistor T2 adopt the oxide thin film transistors, the off-state leakage currents of the first thin film transistor T1 and the second thin film transistor T2 are small, which can keep the voltage level of the first node Q in a relatively stable low voltage level. After the touch scanning is completed, the output process of the next stage gate driving signal of the n-th stage gate driving signal (i.e., the (n+m)-th stage gate driving signal) is entered.

Figure 5:
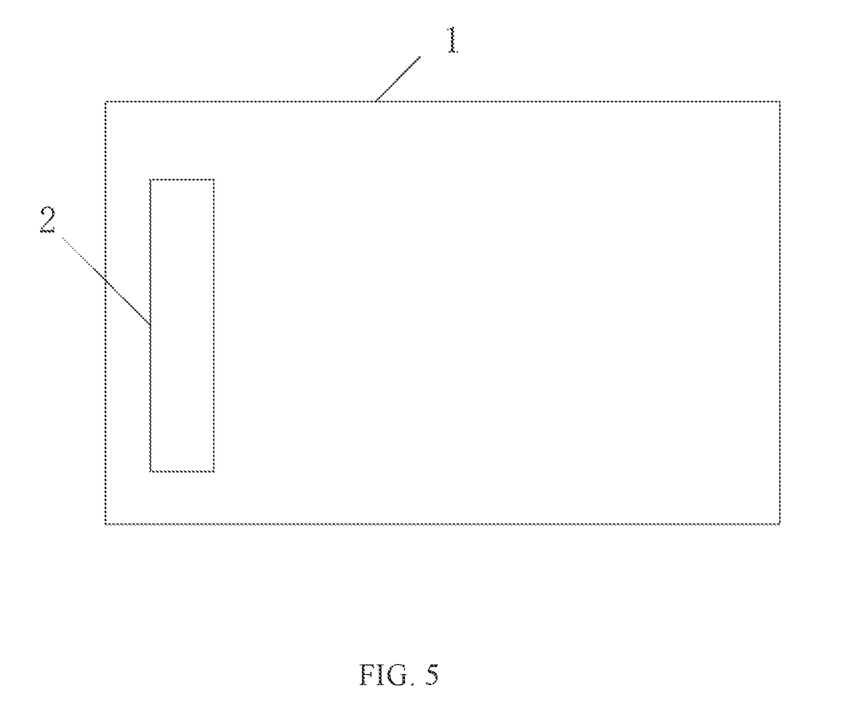
FIG. 5 is a first structural diagram of a display panel disclosed in an embodiment of the present disclosure.
Figure 6:
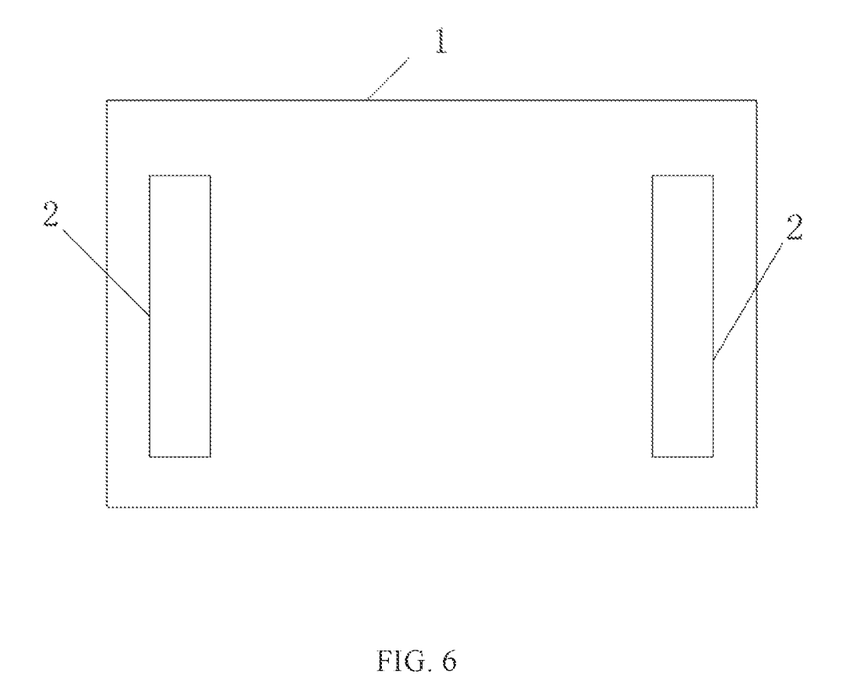
FIG. 6 is a second structural diagram of a display panel disclosed in an embodiment of the present disclosure.

Based on the aforementioned embodiments, a display panel is further disclosed in the embodiments of the present disclosure. The display panel 1 includes the gate driving circuit 2 as described above. The display panel 1 has the same structure and beneficial effects as the gate driving circuit 2 disclosed in the aforementioned embodiments. Since the structure and beneficial effects of the gate driving circuit 2 are described in detail in the aforementioned embodiments, the further description is not given herein.

It should be noted that for a small-size display panel, as shown in FIG. 5, only one side of the display panel 1 can be provided with the gate driving circuit 2, while for a medium and large-size display panel, as shown in FIG. 6, the gate driving circuits 2 can be provided on the opposite sides of the display panel 1.

It can be understood that for one of ordinary skill in the art, equivalent replacements or changes can be made according to the technical solutions and the invention concept of the present disclosure, and all these changes or replacements shall fall within the scope of the following claims of the present disclosure.

What is claimed is:

1. A gate driving circuit comprising a plurality of gate driving units connected in cascade, wherein an n-th stage gate driving unit comprises a pull-up control module and a pull-down module;

wherein the pull-up control module is connected to a first node, a forward scanning signal output terminal, a reverse scanning signal output terminal, an (n−m)-th stage gate driving signal output terminal, and an (n+m)-th stage gate driving signal output terminal, and is configured for pulling up a voltage level of the first node in a normal display stage of the gate driving circuit under controls of a signal outputted from the forward scanning signal output terminal, a signal outputted from the reverse scanning signal output terminal, a signal outputted from the (n−m)-th stage gate driving signal output terminal, and a signal outputted from the (n+m)-th stage gate driving signal output terminal; wherein n and m are positive integers, and n>m;

wherein the pull-down module is connected to the first node, a constant low voltage, an (n+m)-th clock signal output terminal, and an (n−m)-th clock signal output terminal, and is configured for pulling down the voltage level of the first node in the normal display stage of the gate driving circuit under controls of the constant low voltage, an (n+m)-th clock signal, and an (n−m)-th clock signal;

wherein a thin film transistor in the pull-up control module and/or the pull-down module that is connected to the first node is an oxide thin film transistor;

wherein the n-th stage gate driving unit further comprises a gate signal deactivation module, the gate signal deactivation module comprises a fifteenth thin film transistor, a gate of the fifteenth thin film transistor is connected to a second global control signal output terminal, a source of the fifteenth thin film transistor is connected to an n-th stage gate signal output terminal, and a drain of the fifteenth thin film transistor is connected to a constant low voltage output terminal.

2. The gate driving circuit according to claim 1, wherein the pull-up control module comprises a first thin film transistor and a second thin film transistor, a gate of the first thin film transistor is connected to the (n−m)-th stage gate driving signal output terminal, a gate of the second thin film transistor is connected to the (n+m)-th stage gate driving signal output terminal, a source of the first thin film transistor is connected to the forward scanning signal output terminal, a source of the second thin film transistor is connected to the reverse scanning signal output terminal, and a drain of the first thin film transistor and a drain of the second thin film transistor are both connected to the first node; wherein the first thin film transistor and the second thin film transistor are oxide thin film transistors.

3. The gate driving circuit according to claim 1, wherein the pull-down module comprises a fifth thin film transistor and a sixth thin film transistor, a gate of the fifth thin film transistor is connected to the (n+m)-th clock signal output terminal or the (n−m)-th clock signal output terminal, a source of the fifth thin film transistor is connected to the first node, a drain of the fifth thin film transistor is connected to a source of the sixth thin film transistor, and a drain of the sixth thin film transistor is connected to receive the constant low voltage; wherein the fifth thin film transistor is an oxide thin film transistor.

4. The gate driving circuit according to claim 1, wherein the n-th stage gate driving unit further comprises a pull-up module, the pull-up module comprises a third thin film transistor and a fourth thin film transistor, a gate of the third thin film transistor is connected to receive a constant high voltage, a source of the third thin film transistor is connected to the first node, a drain of the third thin film transistor and a gate of the fourth thin film transistor are both connected to a fourth node, a source of the fourth thin film transistor is connected to an n-th clock signal output terminal, and a drain of the fourth thin film transistor is connected to an n-th stage gate driving signal output terminal.

5. The gate driving circuit according to claim 4, wherein the pull-down module further comprises an eleventh thin film transistor, a gate of the eleventh thin film transistor is connected to a second node, a source of the eleventh thin film transistor is connected to the n-th stage gate driving signal output terminal, and a drain of the eleventh thin film transistor is connected to receive the constant low voltage.

6. The gate driving circuit according to claim 5, wherein the n-th stage gate driving unit further comprises a voltage-stabilizing module, the voltage-stabilizing module comprises a first capacitor and a second capacitor, wherein one terminal of the first capacitor is connected to the first node, one terminal of the second capacitor is connected to the second node, and another terminal of the first capacitor and another terminal of the second capacitor are both connected to a constant low voltage output terminal.

7. The gate driving circuit according to claim 1, wherein the n-th stage gate driving unit further comprises a gate signal activation module, the gate signal activation module comprises a twelfth thin film transistor, a thirteenth thin film transistor, and a fourteenth thin film transistor, a gate and a drain of the twelfth thin film transistor, a gate of the thirteenth thin film transistor, and a gate of the fourteenth thin film transistor are all connected to a first global control signal output terminal, a source of the twelfth thin film transistor is connected to a fourth node, a source of the thirteenth thin film transistor and a source of the fourteenth thin film transistor are both connected to a second node, and a drain of the thirteenth thin film transistor and a drain of the fourteenth thin film transistor are both connected to a constant low voltage output terminal.

8. A display panel comprises a gate driving circuit according to claim 1.

9. The display panel according to claim 8, wherein the gate driving circuit comprises a plurality of gate driving units connected in cascade, wherein an n-th stage gate driving unit comprises a first thin film transistor, a second thin film transistor, and a fifth thin film transistor, a gate of the first thin film transistor is connected to an (n−m)-th stage gate driving signal output terminal, a gate of the second thin film transistor is connected to an (n+m)-th stage gate driving signal output terminal, a source of the first thin film transistor is connected to a forward scanning signal output terminal, a source of the second thin film transistor is connected to a reverse scanning signal output terminal, a drain of the first thin film transistor and a drain of the second thin film transistor are both connected to the first node, a gate of the fifth thin film transistor is connected to an (n+m)-th clock signal output terminal or an (n−m)-th clock signal output terminal, and a source of the fifth thin film transistor is connected to the first node, wherein at least one of the first thin film transistor, the second thin film transistor, and the fifth thin film transistor is an oxide thin film transistor.

10. The display panel according to claim 8, wherein the n-th stage gate driving unit further comprises a sixth thin film transistor, a gate of the sixth thin film transistor is connected to a second node, a drain of the fifth thin film transistor is connected to a source of the sixth thin film transistor, and a drain of the sixth thin film transistor is connected to receive a constant low voltage.

11. The display panel according to claim 8, wherein the n-th stage gate driving unit further comprises a third thin film transistor and a fourth thin film transistor, a gate of the third thin film transistor is connected to receive a constant high voltage, a source of the third thin film transistor is connected to the first node, a drain of the third thin film transistor and a gate of the fourth thin film transistor are both connected to a fourth node, a source of the fourth thin film transistor is connected to an n-th clock signal output terminal, and a drain of the fourth thin film transistor is connected to an n-th stage gate driving signal output terminal.

12. The display panel according to claim 11, wherein the n-th stage gate driving unit further comprises an eleventh thin film transistor, a gate of the eleventh thin film transistor is connected to a second node, a source of the eleventh thin film transistor is connected to the n-th stage gate driving signal output terminal, and a drain of the eleventh thin film transistor is connected to receive a constant low voltage.

13. A gate driving circuit comprises a plurality of gate driving units connected in cascade, wherein an n-th stage gate driving unit comprises a first thin film transistor, a second thin film transistor, and a fifth thin film transistor, a gate of the first thin film transistor is connected to an (n−m)-th stage gate driving signal output terminal, a gate of the second thin film transistor is connected to an (n+m)-th stage gate driving signal output terminal, a source of the first thin film transistor is connected to a forward scanning signal output terminal, a source of the second thin film transistor is connected to a reverse scanning signal output terminal, a drain of the first thin film transistor and a drain of the second thin film transistor are both connected to the first node, a gate of the fifth thin film transistor is connected to an (n+m)-th clock signal output terminal or an (n−m)-th clock signal output terminal, and a source of the fifth thin film transistor is connected to the first node, wherein at least one of the first thin film transistor, the second thin film transistor, and the fifth thin film transistor is an oxide thin film transistor;

wherein the n-th stage gate driving unit further comprises a fifteenth thin film transistor, a gate of the fifteenth thin film transistor is connected to a second global control signal output terminal, a source of the fifteenth thin film transistor is connected to the n-th stage gate signal output terminal, and a drain of the fifteenth thin film transistor is connected to the constant low voltage output terminal.

14. The gate driving circuit according to claim 13, wherein the n-th stage gate driving unit further comprises a sixth thin film transistor, a gate of the sixth thin film transistor is connected to a second node, a drain of the fifth thin film transistor is connected to a source of the sixth thin film transistor, and a drain of the sixth thin film transistor is connected to receive a constant low voltage.

15. The gate driving circuit according to claim 13, wherein the n-th stage gate driving unit further comprises a third thin film transistor and a fourth thin film transistor, a gate of the third thin film transistor is connected to receive a constant high voltage, a source of the third thin film transistor is connected to the first node, a drain of the third thin film transistor and a gate of the fourth thin film transistor are connected to a fourth node, a source of the fourth thin film transistor is connected to an n-th clock signal output terminal, and a drain of the fourth thin film transistor is connected to an n-th stage gate driving signal output terminal.

16. The gate driving circuit according to claim 13, wherein the n-th stage gate driving unit further comprises an eleventh thin film transistor, a gate of the eleventh thin film transistor is connected to a second node, a source of the eleventh thin film transistor is connected to an n-th stage gate driving signal output terminal, and a drain of the eleventh thin film transistor is connected to receive a constant low voltage.

17. The gate driving circuit according to claim 16, wherein the n-th stage gate driving unit further comprises a first capacitor and a second capacitor, wherein one terminal of the first capacitor is connected to the first node, one terminal of the second capacitor is connected to the second node, and another terminal of the first capacitor and another terminal of the second capacitor are both connected to a constant low voltage output terminal.

18. The gate driving circuit according to claim 13, wherein the n-th stage gate driving unit further comprises a twelfth thin film transistor, a thirteenth thin film transistor, and a fourteenth thin film transistor, a gate and a drain of the twelfth thin film transistor, a gate of the thirteenth thin film transistor, and a gate of the fourteenth thin film transistor are all connected to a first global control signal output terminal, a source of the twelfth thin film transistor is connected to a fourth node, a source of the thirteenth thin film transistor and a source of the fourteenth thin film transistor are both connected to a second node, and a drain of the thirteenth thin film transistor and a drain of the fourteenth thin film transistor are both connected to a constant low voltage output terminal.

* * * * *